US006734439B2

(12) United States Patent
Weed et al.

(10) Patent No.: US 6,734,439 B2
(45) Date of Patent: May 11, 2004

(54) WAFER PEDESTAL TILT MECHANISM AND COOLING SYSTEM

(76) Inventors: Allan Weed, 399 W. Shore Dr., Marblehead, MA (US) 01945; Roger B. Fish, 66 Page Rd., Bedford, MA (US) 01730

( * ) Notice: Subject to any disclaimer, the term of this patent is extended or adjusted under 35 U.S.C. 154(b) by 214 days.

(21) Appl. No.: 10/054,325

(22) Filed: Oct. 25, 2001

(65) Prior Publication Data

US 2003/0080300 A1 May 1, 2003

(51) Int. Cl.[7] .................................................. H01J 37/20
(52) U.S. Cl. ............................... 250/443.1; 250/490.11
(58) Field of Search ........................... 250/491.1, 492.1, 250/490.11, 492.11, 493.11, 443.1, 492.21, 492.2, 398

(56) References Cited

U.S. PATENT DOCUMENTS

| | | | | |
|---|---|---|---|---|
| 5,040,484 A | * | 8/1991 | Mears et al. | 250/442.11 |
| 5,338,940 A | * | 8/1994 | Takeyama | 250/492.2 |
| 6,246,060 B1 | * | 6/2001 | Ackeret et al. | 250/442.11 |
| 6,313,469 B1 | * | 11/2001 | Tamai | 250/442.11 |
| 6,583,428 B1 | * | 6/2003 | Chipman et al. | 250/492.21 |

FOREIGN PATENT DOCUMENTS

JP          02-068847    *  3/1990 ............... 250/443.1

* cited by examiner

*Primary Examiner*—John R. Lee
*Assistant Examiner*—James P. Hughes
(74) *Attorney, Agent, or Firm*—J. A. Kastelic; D. A. Robitaille

(57) ABSTRACT

The invention provides a wafer pad assembly for use in an ion implanter for mounting and cooling a wafer. The wafer pad assembly comprises a wafer support pad having an upper surface for mounting the wafer and a lower surface. The lower surface of the wafer support pad is connected to a coolant passage having an inlet section and an outlet section arranged in an opposed configuration, wherein said inlet section is counterbalanced by said outlet section. The lower surface is connected to a frame having an outer curved surface in mating engagement with a complementary shaped bearing surface of a housing wherein said wafer can be tilted or rotated about an axis.

17 Claims, 7 Drawing Sheets

WAFER PEDESTAL TILT MECHANISM AND COOLING SYSTEM

FIELD OF THE INVENTION

The invention relates generally to ion implanters for the processing of semiconductor wafers, and more particularly to wafer support pedestals and wafer cooling systems for ion implanters.

BACKGROUND OF THE INVENTION

Ion implanters are used to introduce conductivity-altering impurities into semiconductor wafers. In order to accomplish this, the desired impurity material is ionized via an ion source, and then accelerated to form an ion beam of prescribed energy. The ion beam is then directed at the surface of the semiconductor wafer so that the ions in the beam penetrate the semiconductor material and are embedded in the crystalline lattice thereby forming a region of desired conductivity.

In semiconductor wafer processing, there are several important considerations in achieving an effective ion implanter. One important factor is throughput, or the number of wafers processed per time unit. In addition, wafer transfer time, ion implant time and implanter down time are other important considerations. Another important factor is the ability to implant at high angle tilt. A high tilt angle, generally in the range of about 20 to about 60 degrees, allows doping of the silicon structure beneath an obstruction to the beam. Another important consideration is the ability to cool the wafers during processing.

Serial implanters process silicon wafers one at a time. Batch implanters process a plurality, or batch, of wafers simultaneously. Typical batch ion implanters utilize a rotating disk upon which wafers to be processed are mounted on pedestals. In batch implantation systems, it is important to be able to tilt and cool the wafers without resulting in an unbalanced rotating condition. This condition can occur, for example, when all of the pedestals do not move into position at the same time resulting in the coolant creating an unbalanced load. Thus, an ion implanter system capable of high wafer throughput, uniform dose with the capability of high tilt angle implantation and wafer cooling is desired.

SUMMARY OF THE INVENTION

The invention provides in one aspect a wafer platform including at least one wafer pad assembly for mounting and cooling a wafer and being disposed in an ion implanter. The wafer pad assembly comprises a wafer support pad having an upper surface for mounting the wafer and a lower surface. The lower surface of the wafer support pad is connected to a coolant passage having an inlet section and an outlet section arranged in an opposed configuration, wherein the mass of the inlet section is counterbalanced by the mass of the outlet section.

The invention provides in another aspect a wafer pad assembly for mounting a wafer and being disposed in an ion implanter. The wafer pad assembly comprises a wafer support pad having an upper surface for mounting the wafer and a lower surface for mounting one or more coolant passages. The lower surface is connected to a frame having an outer curved surface in mating engagement with a complementary shaped bearing surface of a housing wherein the wafer can be rotated about the axis of the centerline of the wafer mounted on the pad.

These and other aspects and advantages of the present invention will be readily understood and appreciated by those skilled in the art from the following detailed description of the preferred embodiments with the best mode contemplated for practicing the invention in view of the accompanying drawings.

DETAILED DESCRIPTION OF THE INVENTION

Figure 1:
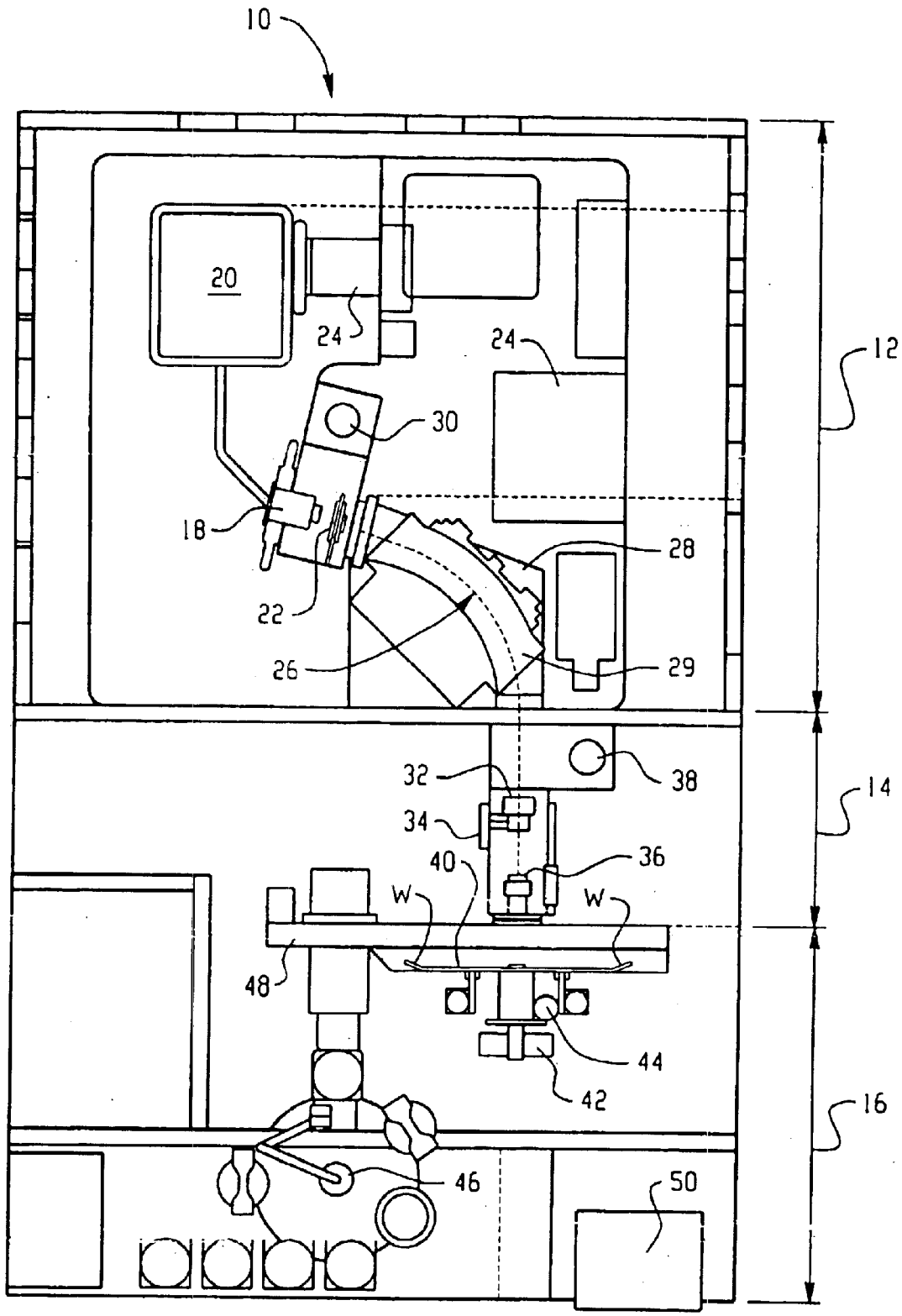
FIG. 1 is a plan view of an ion implantation system.

Referring now to the drawings, FIG. 1 discloses an ion implanter, generally designated at 10, which comprises a terminal 12, a beamline assembly 14, and an end station 16. Generally, the terminal 12 outputs an ion beam, and the beamline assembly 14 adjusts the focus, ion species and energy level of the ion beam and directs it toward a wafer W positioned at the end station 16.

The terminal 12 includes an ion source 18 having a chamber in which dopant gas from a gas box 20 is injected. Energy is imparted to the ionizable dopant gas to generate positive ions within the source chamber. An extraction electrode 22 powered by high voltage supply 24 extracts a beam 26 of positive ions from the source chamber and accelerates the extracted ions toward a mass analysis magnet 28. The mass analysis magnet 28 functions to pass only ions of an appropriate charge-to-mass ratio on to the beamline assembly 14. Evacuation of the beam path 29 provided by the mass analysis magnet 28 is provided by vacuum pump 30.

The beamline assembly 14 comprises a quadrature lens 32, a flag Faraday 34, an electron shower 36, and optionally an ion beam acceleration\deceleration electrode (not shown). The quadrature lens 32 focuses the ion beam output by the terminal 12 and the flag Faraday 34 measures ion beam characteristics during system setup. The optional acceleration\deacceleration electrode may be used to accelerate or deaccelerate the focused ion beam to a desired energy level prior to implantation into a wafer at the end station 16. Evacuation of the beam path provided by the beamline assembly 14 is provided by vacuum pump 38.

The end station 16 includes a wafer platform such as a rotatable disk 40 about the periphery of which a plurality of wafers W are mounted on pedestals. A rotary disk drive mechanism 42 is provided for imparting rotational motion to the disk, and a linear drive mechanism 44 is also provided for imparting linear motion to the disk. A robotic arm 46 loads wafers W onto the disk 40 via a load lock chamber 48. Operation of the system is controlled by an operator control station 50 located at the end of the end station 16.

Figure 2:
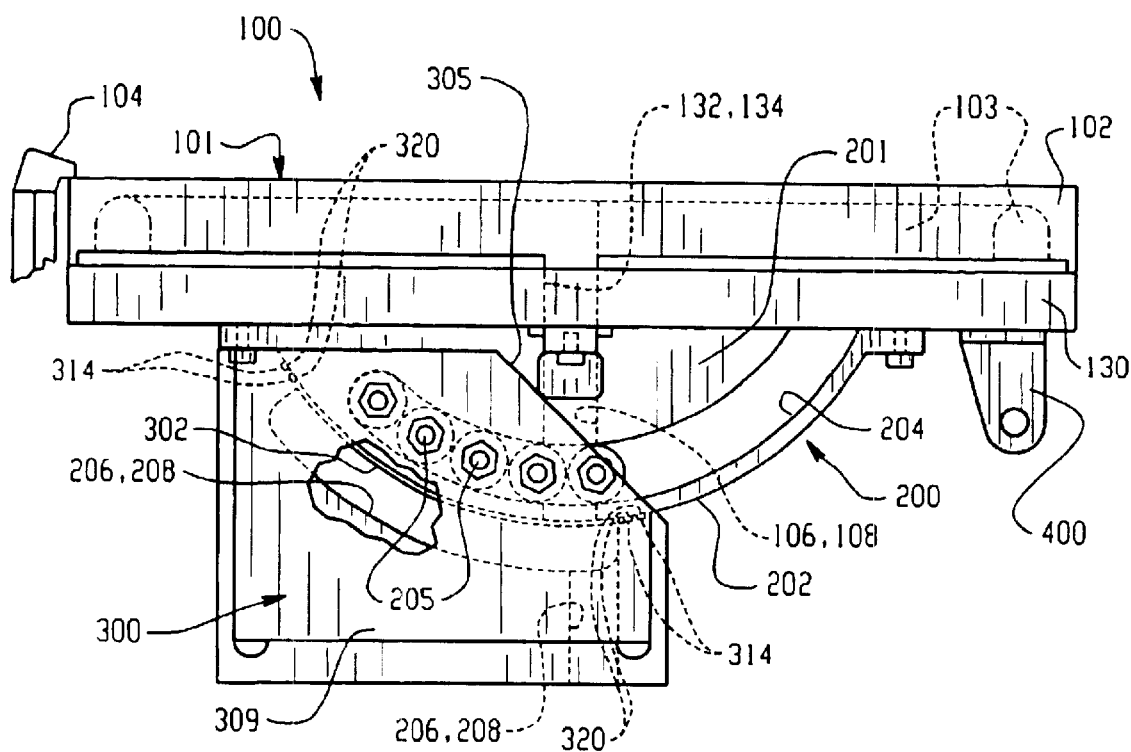
FIG. 2 is a side view of a wafer pedestal assembly and cooling system of the present invention.
Figure 2A:
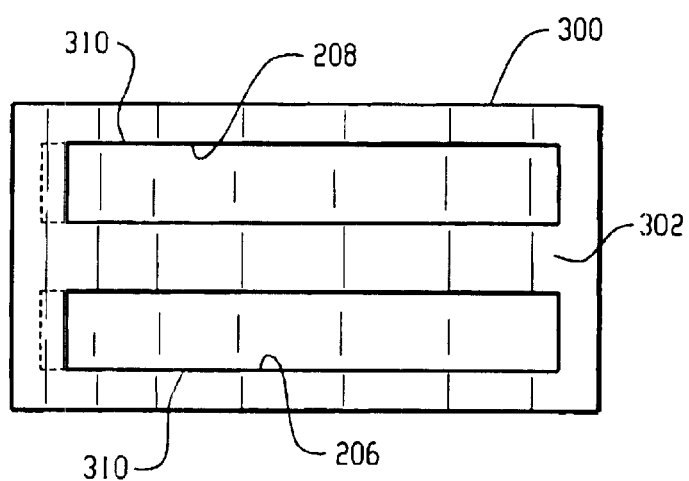
Figure 6:
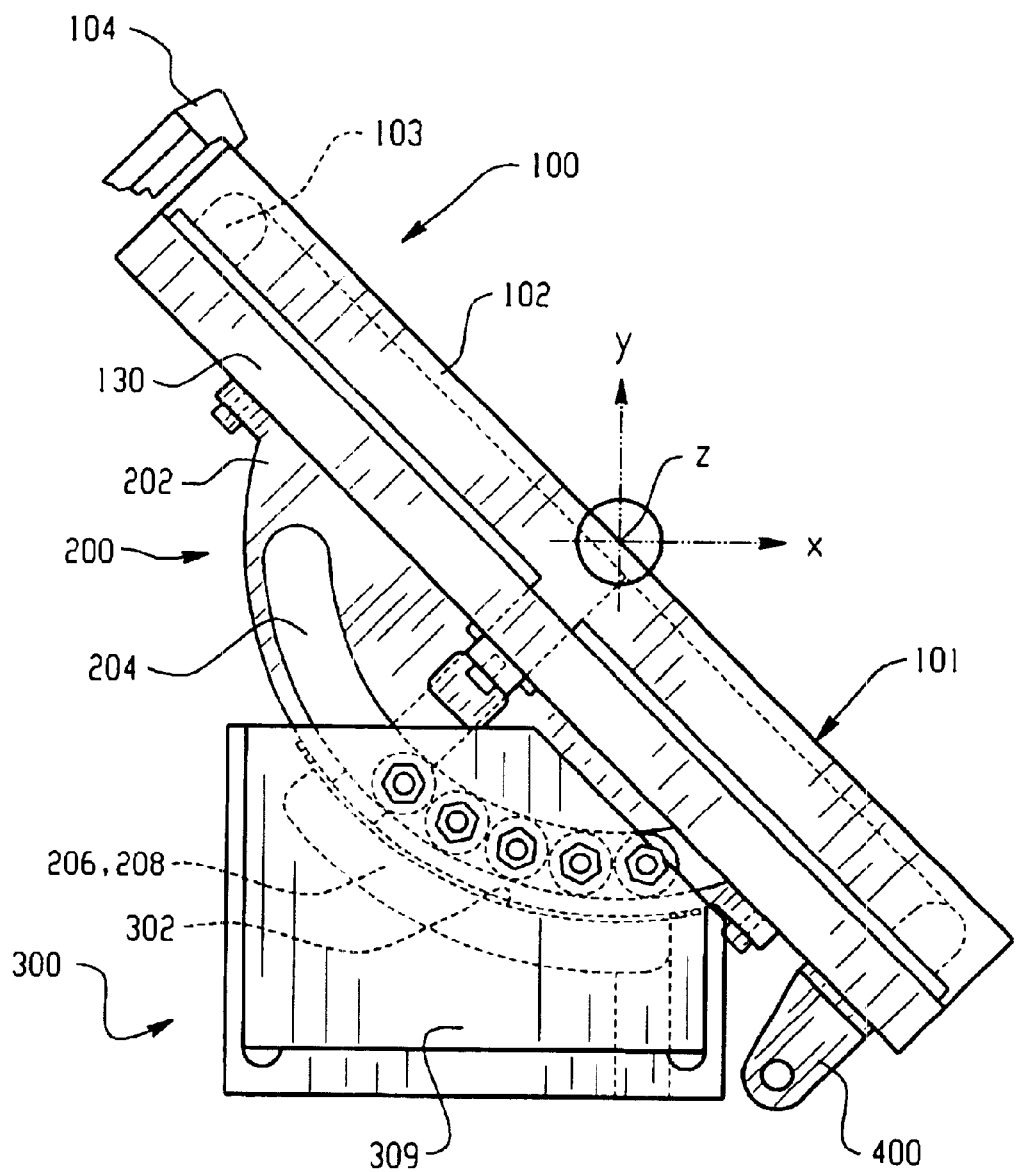
FIG. 6 is a side view of a wafer pedestal assembly and cooling system of the present invention shown in a tilted position.

The pedestals on the rotatable disk 40, upon which the wafers are mounted, each include a wafer pad assembly 100 constructed according to the present invention, as shown in FIG. 2. The wafer pad assembly, shown generally at 100, provides for high angle tilting of the wafer mounted thereon in the range of about zero to about 45 degrees. Tilting is defined herein as the rotation of the wafer W about the z axis, of the x,y,z coordinate system of the wafer pad assembly 100 as shown in FIG. 6. Preferably, the geometric centers of each wafer W is aligned with the z axis so that each wafer is tilted about its geometric center.

Each wafer W is mounted upon and clamped to a wafer support pad 102 via one or more conventional clamps 104 such as a mechanical or electrostatic clamp or other means known to those skilled in the art. The wafer support pad 102 comprises a circular plate which has a substantially flat upper surface 101 for mounting a wafer W thereon. Mounted to the undersurface of the wafer support pad 102 is one or more cooling passages 103 (hereinafter referred to as "cooling passage") for circulating coolant in order to cool the support pad 102 and hence the wafer. The cooling passage 103 may be mounted to the underside of wafer support pad 102 by dip brazing, mechanical fasteners or any other conventional means known to those skilled in the art. The cooling passage 103 preferably has a circular cross section and is comprised of a material having a high thermal conductivity such as aluminum. It is even more preferable that the interior surfaces of the cooling passages be coated with an anti-wear coating such as polytetrafluroethylene (PTFE) or any other form of hardcoat that prevents degradation of the pad base material.

Figure 3:
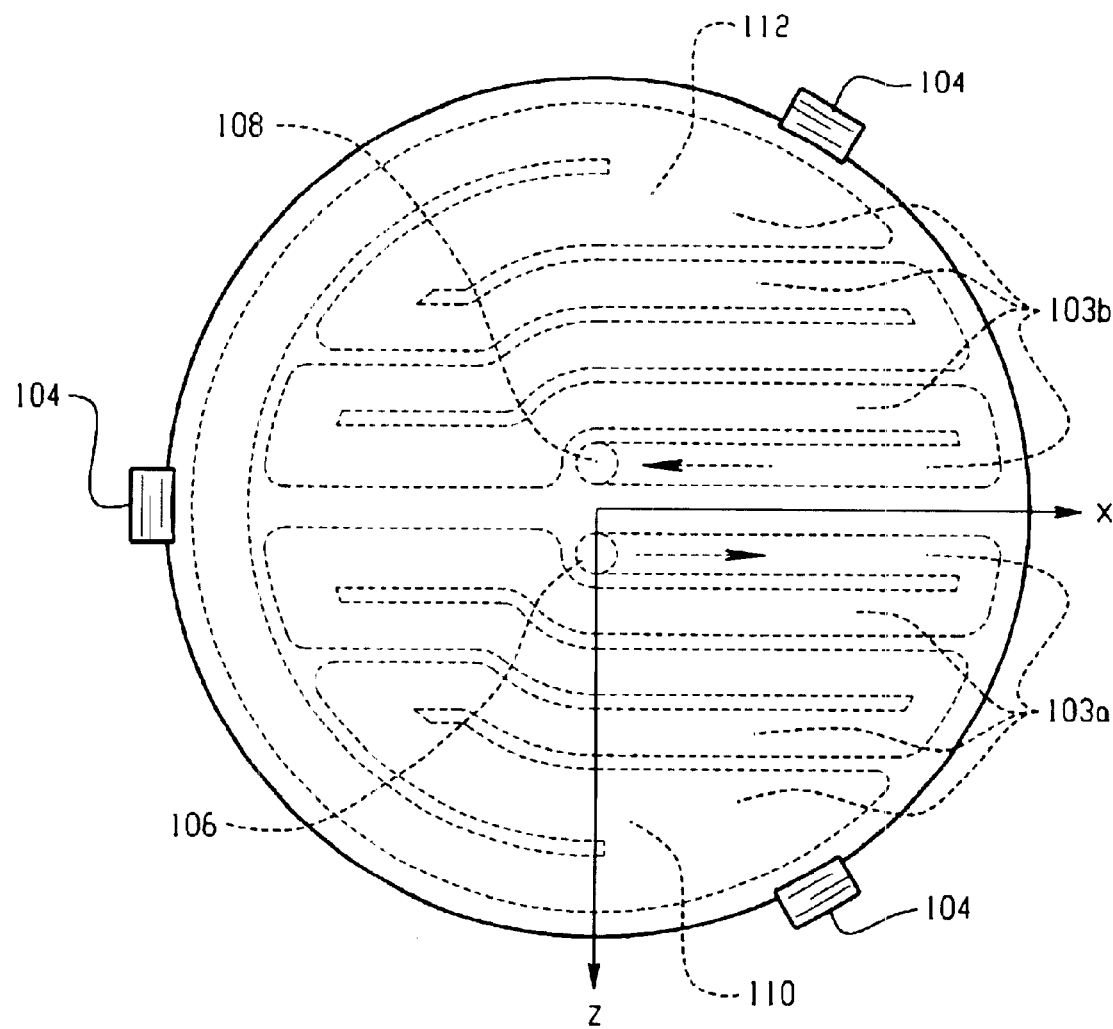
FIG. 3 is a top view of the wafer pedestal assembly shown in FIG. 2.
Figure 5:
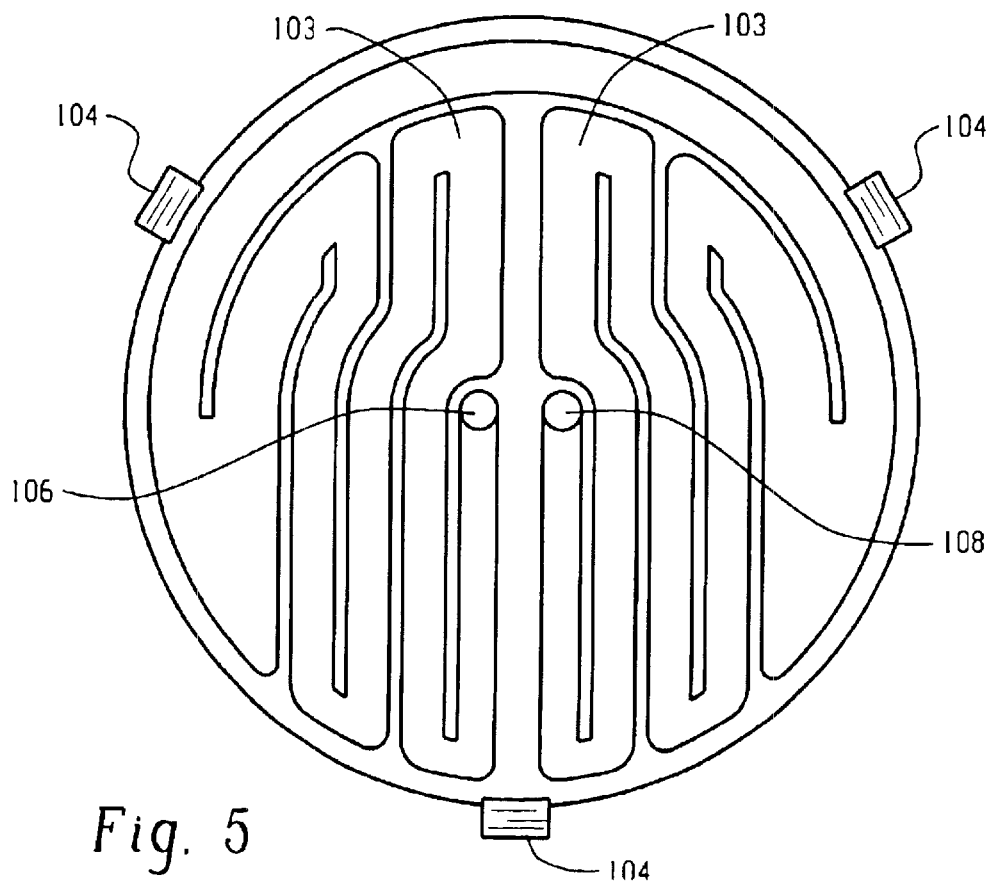
FIG. 5 is a top view of the cooling passages of the wafer pedestal assembly shown in FIG. 4.

As shown in FIGS. 3 and 5, the cooling passage 103 has an inlet end 106 and an outlet end 108 located near the centerpoint of the wafer support pad 102. More specifically, the geometric centers of the inlet end 106 and the outlet end 108 are spaced in an opposed configuration equidistant from the geometric center of the pad 102 (which corresponds to the center of the wafer W mounted thereon). The coolant passage is arranged in a serpentine fashion that is symmetrical about an axis x of the wafer support pad 102.

As shown in FIG. 3 for illustrative purposes, the coolant passage is denoted as two sections "103a" and "103b", wherein 103a is representative of the inlet section of the coolant passage, and 103b is representative of the outlet section of the coolant passage. As further shown in FIG. 3, section 103a and 103b are symmetrical about the x axis. This symmetrical relationship results in the mass of coolant situated at the inlet section of the coolant passage 103a being counterbalanced by the mass of coolant situated at the outlet section of the coolant passage, denoted as 103b. The end 110 of the inlet cooling passage 103a feeds into the inlet end 112 of the outlet cooling passage. The inlet coolant section 103a and the outlet coolant section 103b may also be arranged in numerous other configurations (not shown) such that the mass of coolant situated at the inlet section of the coolant passage 103a is counterbalanced by the mass of coolant situated at the outlet section of the coolant passage.

The coolant provided in the inlet and outlet cooling passages may be any suitable cooling fluid such as water, antifreeze, freon or mixtures thereof, or any other suitable coolant known to those skilled in the art.

Referring back to FIG. 2, the lower surface of the wafer support pad 102 is secured to a fixed cover plate 130. The cover plate 130 is also a flat circular plate and is preferably made of aluminum material, and functions to enclose the cooling passages and to mount the assembly to a radius frame 200. The cover further comprises an inlet feed hole 132 and an outlet return hole 134 for receiving therethrough the ends 106, 108 of the respective inlet and outlet cooling fluid passages.

The wafer pad radius frame 200 is mounted to the under surface of the cover plate 130. The radius frame 200 comprises an outer wear surface 202 having an exterior curved surface to allow rotation or "tilt motion" of the wafer pad assembly about the z axis (see FIG. 6), which is also the geometric centerline of the top of the mounted wafer. The outer wear surface 202 has an outer convex surface and is aligned for slidable engagement with a complementary shaped bearing surface 302 of cam housing 300.

As the outer wear surface 202 slidably engages the bearing surface 302, the wafer is preferably rotated about its geometrical center. The radius shape of the outer wear surface allows tilting of the wafer from zero degrees to about 45 degrees. The outer wear surface 202 is formed of a material having a low coefficient of friction such as hard chrome, nickel plated steel or aluminum material.

Figure 4:
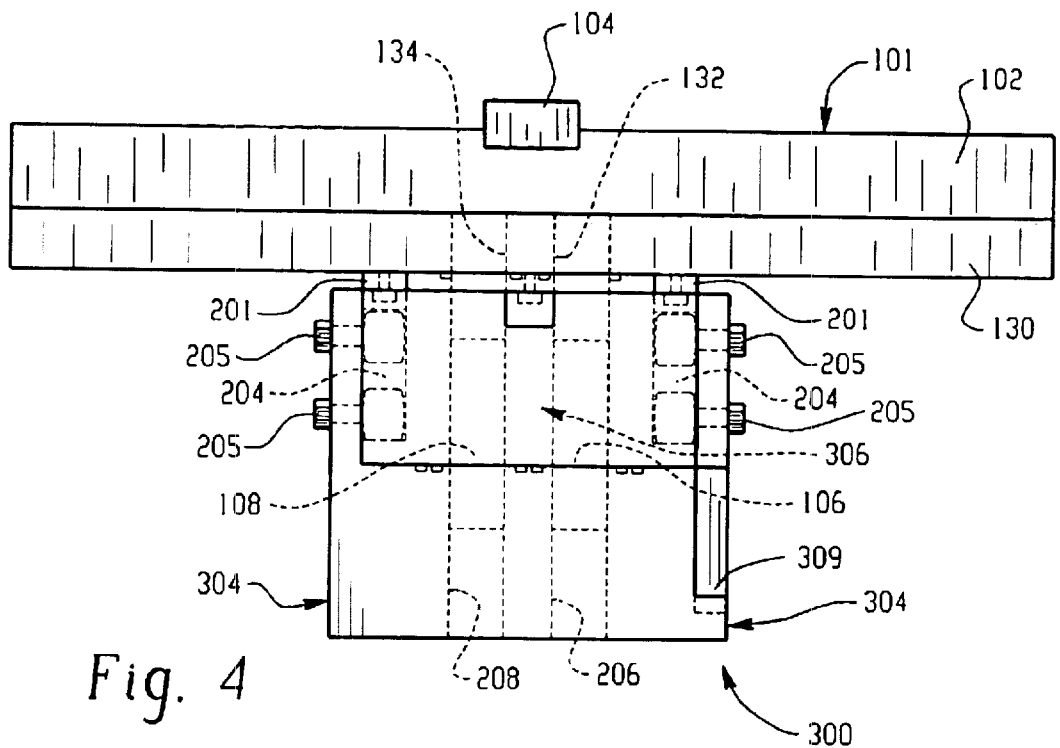
FIG. 4 is a front view of the wafer pedestal assembly and cooling system of the invention shown in FIG. 2.

As shown in FIG. 4, the radius frame 200 has a rectangular cross section with opposed sidewalls 201. Mounted within the sidewalls 201 are one or more curved cam follower raceways 204. Preferably, two opposed raceways 204 are utilized. The cam follower raceways 204 have the same curvature as the outer wear surface 202. Received within each of the raceways 204 are one or more cam followers 205, which function to secure the radius frame 200 to the cam housing 300 while allowing the outer wear surface 202 of the frame 200 to slidably engage the cam bearing surface 302 so that the wafer can tilt (refer back to FIG. 2). The cam followers 205 further function to carry the centrifugal load of the spinning disk 40 as well as to maintain the seal gap located between the rotating inlet and outlet ends 106, 108 of the coolant passage 103 and fixed passageways or lines 206 and 208, as described in more detail below.

The cam housing 300 has a generally rectangular shape with opposed parallel sidewalls 304, the cam bearing surface 302, and an internal cavity 306. Preferably one of the sidewalls 304 is partially formed by a removable plate 309 for accessing the interior portion of the internal cavity. Sidewalls 304 preferably have truncated interior corners 305 so that the radius frame 200 can rotate without interference (FIG. 2).

Contained within the internal cavity 306 are feed and return coolant lines 206, 208 which are connected to and along the curved underside of the cam bearing surface 302. The feed and return coolant lines 206, 208 are in fluid communication with the respective ends 106, 108 of the coolant passage 103. It is important to note that the ends 106, 108 of the coolant passage 103 rotate or tilt with the semi-hemispherical radius frame 200 and maintain fluid communication with the non-rotating return and feed coolant lines 206, 208 during rotation.

In addition, as the semi-hemispherical radius frame 200 rotates, the interface of the outer wear surface 202 of the frame and the bearing surface 302 functions as a seal to prevent coolant from escaping from passageways 310 of the curved bearing surface 302. Preferably, one or more grooves 314 (See FIG. 2) surround the periphery of the passageways 310 of the cam bearing surface 302 wherein one or more seals 320, preferably o-ring, are provided therein to prevent coolant from escaping from the internal cavity. An optional second set of grooves and seals may be used as an indicator of coolant leakage from the cam housing 300.

Figure 7:
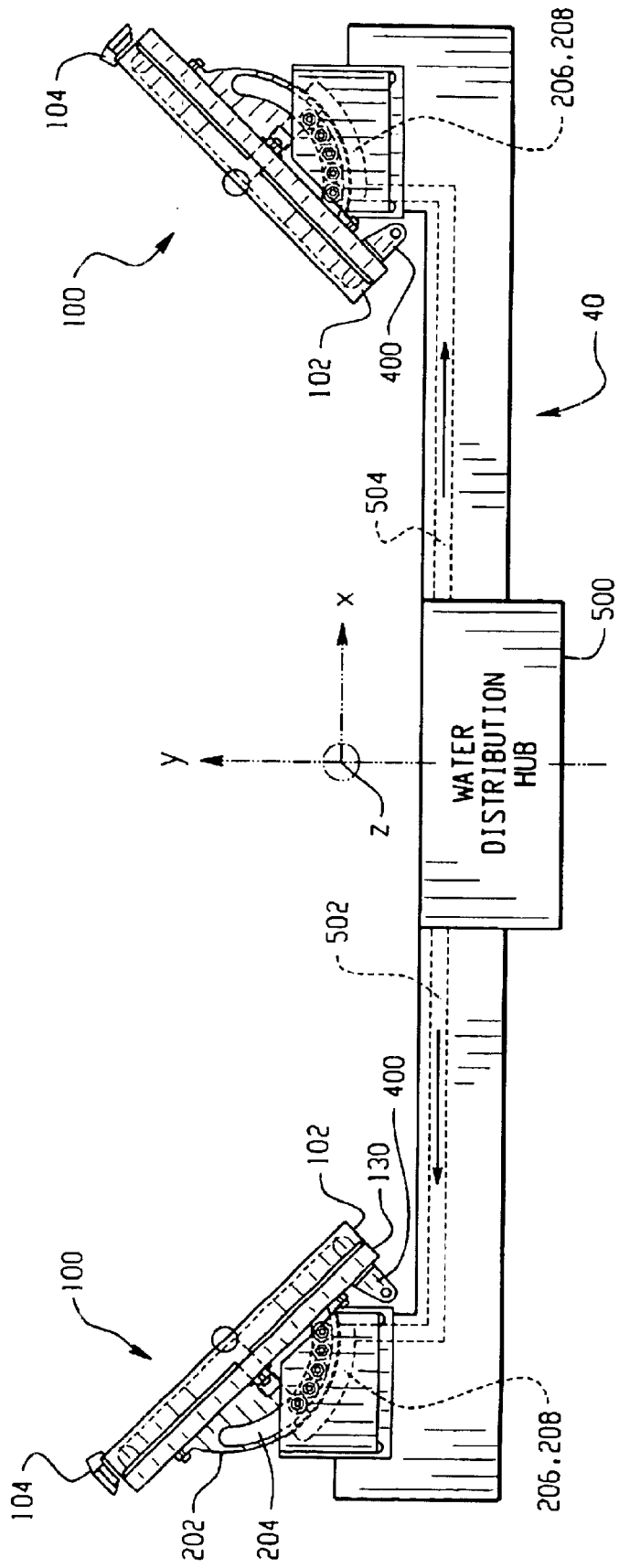
FIG. 7 is a perspective side view of a plurality of wafer pedestal assemblies mounted upon a disk of a batch type ion implanter.

As shown in FIG. 7, the wafer pedestal assembly 100 further comprises a flange 400 for connecting to an actuator. The actuator may comprise linkages, cables, electric actuators or any suitable means to convey the motion to the movable portion of the wafer pad. FIG. 7 illustrates the side perspective view of an ion implanter disk having two or more wafer pedestal assemblies of the invention mounted thereon. The wafer pedestal assemblies 100 are shown tilted about the z-axis at a 45 degree orientation (with respect to the x-axis). A coolant (in this case water) distribution hub 500 is shown located near the center portion of the disk 40 with coolant manifold system lines 502, 504 extending radially outward in fluid communication with the return and feed lines 206, 208 of the pedestal assembly.

While the wafer cooling system has been shown and described in conjunction with an assembly for tilting wafers, the above referenced cooling system is not limited to such application. For example, the wafer cooling system could also be used in conventional batch or serial ion implanters. Further, while the wafer pedestal tilting mechanism is shown primarily for use in a batch type ion implanter, the invention could also be used in conjunction with serial ion implanters. Finally, the wafer pedestal tilting mechanism could also be used with other cooling systems.

Figure 8:
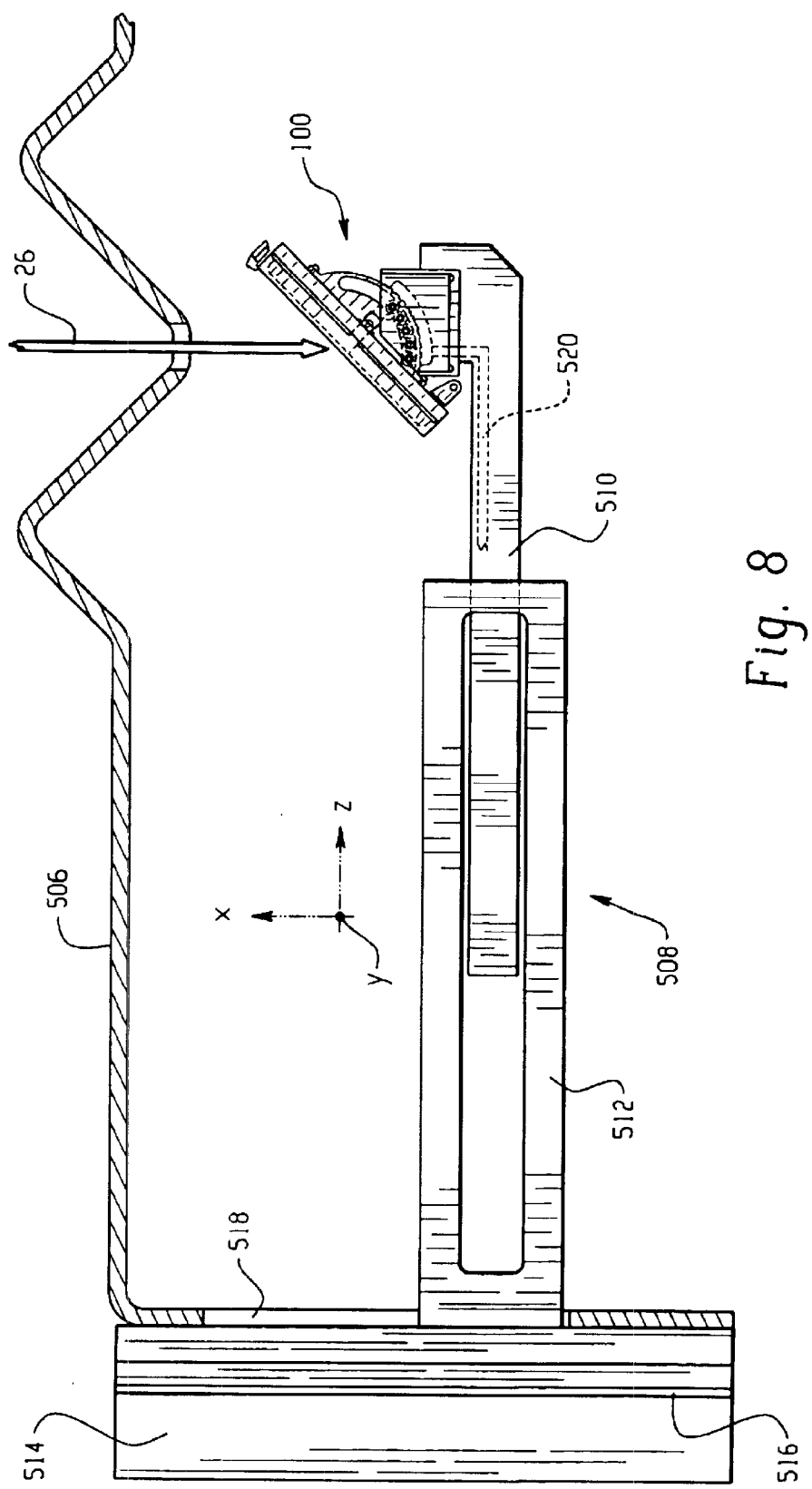
FIG. 8 is a perspective side view of a single wafer pedestal assembly mounted within the process chamber of a serial type ion implanter.

FIG. 8 shows the implementation of a single wafer pedestal assembly 100 mounted within the process chamber 506 of a serial type ion implanter. The pedestal assembly is positioned in front of a fixed position ion beam 26 by means of a telescopic arm assembly 508 comprising an inner arm 510 disposed within an outer sleeve 512. The pedestal assembly 100 is mounted directly to the inner arm 510.

The wafer on the pedestal assembly is scanned in front of the fixed position ion beam 26 along the x-axis and the z-axis simultaneously. The x-scan is accomplished by moving the telescopic arm assembly 508 along the x-axis by means of a linear translator 514. A sliding seal 516 is provided between the linear translator 514 and the process chamber 506 to maintain a vacuum condition within the process chamber. A slot 518 in the wall of the process chamber permits this linear movement of the telescopic arm assembly along the x-axis. A coolant channel 520 is provided within the inner arm 510 for providing coolant from an external source (not shown) through the telescopic arm assembly. The coolant channel 520 is in fluid communication with the return and feed lines 206, 208 of the pedestal assembly 100.

The z-scan is accomplished by telescoping the inner arm 510 into and out of the outer sleeve 512 of the telescopic arm assembly 508. The actuator mechanisms (not shown) for effecting the x-scan and the z-scan linear motion are known in the art. The x-scan and z-scan motions are performed simultaneously during the implant process so that the relationship of the ion beam and the surface of the wafer being implanted remains fixed across the entire surface of the wafer, even when tilted as shown. That is, the distance between the wafer surface being implanted and a particular point along the beam path remains constant throughout the implant process. In the embodiment of FIG. 8, the wafer pedestal assembly 100 is tilted about the y-axis.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

We claim:

1. A wafer platform disposed within an ion implanter and including at least one wafer pad for mounting and cooling a wafer, the wafer pad assembly comprising:
    a wafer support pad having an upper surface for mounting said wafer and a lower surface, said lower surface of said wafer support pad being connected to a coolant passage having an inlet section and an outlet section arranged in an opposed configuration, wherein a mass of said inlet section is counterbalanced by a mass of said outlet section;
    wherein said lower surface of said wafer support is connected to a frame having an outer curved surface in mating engagement with a complementary shaped bearing surface of a housing wherein said wafer can be rotated about an axis.

2. The wafer platform of claim 1, wherein an inlet end of said inlet section and an outlet end of said outlet are located proximate to the center of said upper surface.

3. The wafer platform of claim 1, wherein said coolant passage is arranged in a serpentine configuration.

4. The wafer platform of claim 1, wherein said inlet section and said outlet section are arranged in a symmetrical configuration.

5. The wafer platform of claim 1, wherein said bearing surface further comprises a feed passageway and a return passageway in fluid communication with a feed line and a return line, respectively.

6. The wafer platform of claim 5 wherein said feed line and said return line are in fluid communication with the inlet and the outlet of the cooling passage, respectively.

7. The wafer platform of claim 1 wherein said frame further comprises a curved receway secured to the housing via one or more cam followers.

8. The wafer platform of claim 5 wherein the outer curved surface of the frame functions to seal the feed and return passageways of the bearing surface.

9. The wafer platform of claim 1, wherein said at least one wafer pad assembly comprises a plurality of wafer pad assemblies located thereon.

10. A wafer pad assembly for mounting a wafer and being disposed in an ion implanter, the wafer pad assembly comprising:
    a wafer support pad having an surface being connected to a frame having an outer curved surface in mating engagement with a complementary shaped bearing surface of a housing wherein said wafer can be rotated about an axis.

11. The wafer pad assembly of claim 10 wherein said outer curved surface is convex.

12. The wafer pad assembly of claim 10 wherein said frame further comprises a curved raceway secured to the housing via one or more cam followers.

13. The wafer pad assembly of claim 10 wherein said wafer is tiltable about an axis in the range of about 0 to about 45 degrees.

14. The wafer pad assembly of claim 10 wherein said frame further comprises opposed raceways secured to the housing via a plurality of cam followers.

15. The wafer pad assembly of claim 10 further comprising a cooling passage connected to the lower surface of said wafer support pad; said cooling passage having an inlet section and an outlet section, wherein a mass of said inlet section is counterbalanced by a mass of said outlet section.

16. The wafer pad assembly of claim 15 wherein said bearing surface further comprises a return passageway and a feed passageway, wherein said return passageway is in fluid communication with a return line and the outlet of the cooling passage; and said feed passageway is in fluid communication with the feed line and the inlet of the cooling passage.

17. The wafer pad assembly of claim 15 wherein said bearing surface seals said return passageway and said feed passageway.

* * * * *